WIDE RANGE TUNING INDICATOR

Filed Aug. 23, 1949

WITNESSES:

E. A. McBlakey.

Leon M. Garman

INVENTOR

Mark I. Jacob.

BY

F. E. Browder

ATTORNEY

Patented Oct. 16, 1951

2,571,887

UNITED STATES PATENT OFFICE 2,571,887

WIDE RANGE TUNING INDICATOR

Mark I. Jacob, Baltimore, Md., assignor to Westinghouse Electric Corporation, East Pittsburgh, Pa., a corporation of Pennsylvania Application August 23, 1949, Serial No. 111,870

8 Claims. (Cl. 250—40)

Figure 1:
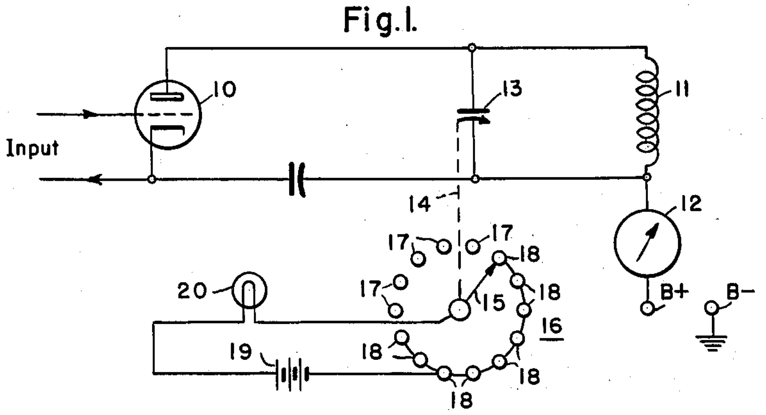

This invention relates to tuning indicators for indicating which portions of wide range, electrical circuits are being tuned by tuning controls, and relates more particularly to tuning indicators for indicating which portions of wide range, tank circuits of radio frequency oscillators or radio frequency amplifiers, are being tuned by tuning controls.

It is often desirable to have a radio transmitter which may be operated at a number of different frequencies with but a single set of components for tuning its tank circuit. A typical tank circuit of such a transmitter may have a single tuning capacitor adapted to be connected to a tank inductor, the combination covering a frequency range $f_0$ to $f_1$. Often where the frequency $f_1$ is more than twice $f_0$, the tuning capacitor may be rotated to tune the inductor to a harmonic frequency $2f_0$, $3f_0$, etc., as well as to the fundamental frequency $f_0$. In order to prevent improper operation, it has been the practice in the past to provide dials on the tuning controls, calibrated in frequency. Where, however, more than one frequency band is covered with the same control, the calibrated dial becomes complicated since it must show all of the frequency bands, it must have a calibration covering each band, and it must show which set of calibration figures are applicable to each band, or it must have mechanism for cancelling the calibration marks of the bands which are not being tuned. An elaborate, complicated and expensive dial would be necessary where a large number of frequency ranges are involved.

This invention provides a simple, inexpensive, tuning indicator for indicating which band of several frequency bands tunable by a single tuning control, is being tuned, and which includes means for indicating to an operator of a tuning control when it has tuned its associated circuit to a selected frequency.

A dip in the plate current of an oscillator or amplifier tube is used to indicate when the tank circuit is tuned to resonance at a particular frequency. To prevent a dip in plate current when the tank circuit is tuned to a harmonic of the selected frequency from deceiving the operator, a signal, such as an incandescent lamp, is energized when the tuning control is in positions to tune the tank circuit to harmonics of the selected frequency. An operator would, while actuating the tuning control, watch an ammeter in the plate circuit of the oscillator or amplifier tube of the transmitter. When a dip in plate current would occur without the signal being energized, the operator would know that the tank circuit was tuned to the selected frequency, and not to a harmonic thereof.

In one embodiment of the invention in which a variable capacitor is used to tune a tank inductor to cover a wide frequency range, the rotor of the capacitor is mechanically connected to the rotatable switch arm of a wafer-type switch. The switch has contacts arranged to be wiped by rotation of its switch arm. The tuning capacitor when connected to the tank inductor will, during a portion of the rotation of its rotor, cover a low frequency band, and during another portion of the rotation of its rotor will cover a higher frequency band which will include harmonics of frequencies in the lower frequency band. The contacts of the wafer switch which will be wiped by the rotation of its contact arm by the rotation of the capacitor, when it is tuning the higher frequency band, are connected in a signal circuit so that a signal, which may be an incandescent lamp, is energized when the rotor of the tuning capacitor is rotated to tune to frequencies above the desired band. Thus, when a dip in the plate current of the oscillator or amplifier tube occurs, when the signal is energized, the operator of the signal control will know that the tank circuit is tuned to a harmonic of the selected frequency, instead of to the fundamental thereof.

In another embodiment of the invention an inductor and capacitor are used to continuously tune a radio frequency amplifier over a wide frequency range $f_0$ to $f_1$ where $f_1$ may be more than $2f_0$. The oscillator or driver amplifier stage which precedes this amplifier includes a capacitor, a tapped inductor and a frequency band selector switch, the contacts of which are connected to the taps on the inductor. The rotor of the capacitor which tunes the last amplifier is mechanically connected to the rotatable switch arms of similar wafer-type switches, one switch for each frequency band. The switches have contacts arranged to be wiped by rotation of their switch arms. A range selector switch has its switch arm mechanically connected to the switch arm of the frequency band, selector switch of the preceding stage. The contacts of the range selector switch are electrically connected to the switch arms of the wafer switches. The tuning capacitor of the last amplifier will, when the frequency range switch is connected to each tap of the inductor, during a portion of the rotation of its rotor, cover a low frequency band, and during another portion of the rotation of its rotor, will cover a higher frequency band which will include harmonics of frequencies in the lower frequency band. When, however, the range switch is in the low frequency range position for a particular tap on the tank inductor, the switch arm of the wafer switch which corresponds to that position is connected into a signal circuit. The contacts of the wafer switch which will be wiped by the rotation of its contact arm by the rotation of the capacitor of the final amplifier, when it is tuning the higher frequency band for a particular tap on the tank coil, are connected in a signal circuit so that a signal, which may be an incandescent lamp, is energized when the range switch is positioned to select a low frequency band for a particular tap on the tank inductor when the rotor of the tuning capacitor is rotated to tune to frequencies above the desired band. Thus, when a dip in the plate current of the amplifier tube occurs, when the signal is energized, the operator of the signal control will know that the tank circuit is tuned to a harmonic of the selected frequency instead of the fundamental thereof.

An object of the invention is to simplify tuning indicators for wide range tuning circuits.

Another object of the invention is to simplify tuning indicators for multi-band tuned circuits.

Another object of the invention is to indicate when a circuit is tuned to a harmonic of a selected frequency.

Figure 2:
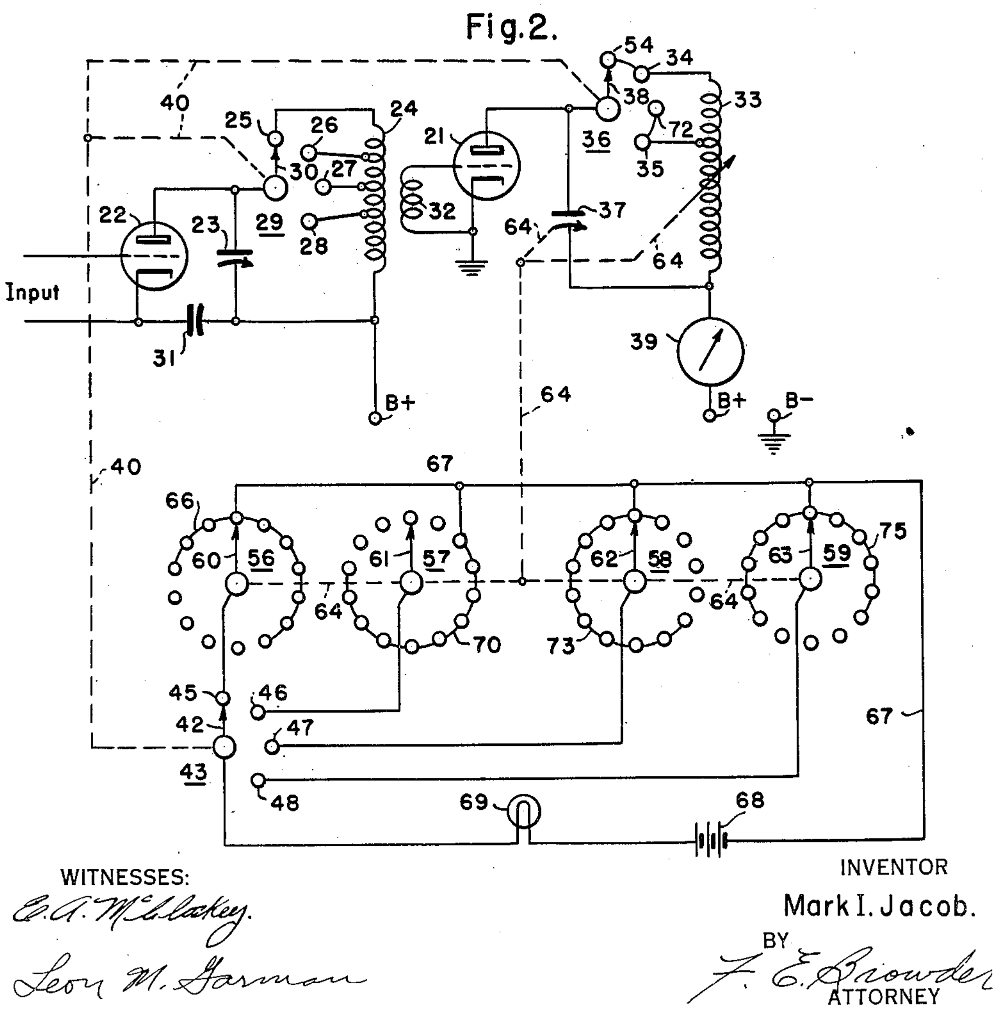

The invention will now be described with reference to the drawing, of which:

Figure 1 is a circuit schematic illustrating the invention as embodied in a wide range, tuning circuit, and Fig. 2 is a circuit schematic illustrating the invention as embodied in a multi-band, tank circuit of a radio frequency amplifier.

Referring first to Figure 1, the tube 10 which may be a radio frequency oscillator or radio frequency amplifier, has the tank inductor 11 connected in its plate circuit. The inductor is connected through the ammeter 12 to the positive terminal B+ of a conventional plate current supply source B+, B—.

The inductor is shunted by the tuning capacitor 13 which during a portion of the rotation of its rotor, will tune the inductor to cover a low frequency range, and during another portion of the rotation of its rotor, will tune the inductor to cover a higher frequency range which will include harmonics of frequencies in the low frequency range.

The rotor of the capacitor is connected by the mechanical linkage 14 to the rotary switch arm 15 of the wafer-type switch 16, whereby rotation of the rotor of the capacitor causes rotation of the switch arm.

The switch has the contacts 17 which are arranged to be wiped by the switch arm when the rotor of the capacitor is tuning the tank inductor to cover the low frequency range, and has the contacts 18 which are arranged to be wiped by the rotor of the capacitor when it is tuning the tank inductor to cover the higher frequency range.

The contacts 18 are connected together and in series with the battery 19 and the signal lamp 20, to the switch arm 15, whereby when the switch arm is on any of the contacts 18 the lamp 20 will be lighted.

In operation, when the capacitor 13 is tuning the inductor 11 to cover the low frequency range, the switch arm 15 will wipe the inactive contacts 17, and the absence of illumination from the lamp 20 when a dip in plate current shown by the meter 12, will indicate to the operator of the tuning control, that the tank circuit is tuned to resonance at a selected frequency in the low frequency range.

When the dip in plate current occurs when the rotor of the capacitor 13 is tuning the tank circuit to a harmonic of the selected frequency, the switch arm 15 will be wiping one of the contacts 18, and the energizing circuit of the lamp 20 will be completed, indicating to the operator of the tuning control that when a dip in the plate current of the tube 10 occurs, the tank circuit is tuned to a harmonic of the selected frequency instead of the fundamental thereof.

Referring now to Fig. 2, the radio frequency, amplifier tube 21 has its input circuit coupled to the tank circuit of the preceding, radio frequency, amplifier tube 22. This tank circuit includes the variable capacitor 23 and the tank inductor 24 having taps connected to the contacts 25, 26, 27 and 28 of the frequency band, selector switch 29.

The rotary switch arm 30 of the switch 29 is connected to the stator of the capacitor 23 and to the plate of the tube 22. The rotor of the capacitor 23 is connected to the tank coil which is connected to a positive terminal of the plate current supply source, and through the blocking capacitor 31 to the cathode of the tube 22. The control grid and cathode of the tube 22 are connected to a conventional input circuit of a radio transmitter.

The control grid and cathode of the tube 21 are connected to the coil 32 which is inductively coupled to the tank inductor 24. The tank circuit of the tube 21 includes the variable tank inductor 33 having taps connected to the contacts 34 and 35 of the frequency band selector switch 36. The capacitor 37 which tunes the inductor 33, is connected to the rotary switch arm 38 of the switch 36, and to the inductor 33. The inductor 33 is connected through the ammeter 39 to the positive terminal of the plate current supply source.

The tank circuit of the tube 21 is adapted to be tuned in two steps by adjustment of the switch arm 38, and rotation of inductor 33 and of the rotor of the capacitor 37, from 2.0 megacycles to 26.0 megacycles. This range is covered in the tank circuit of the tube 22, in four steps by adjustment of the switch arm 30 and rotation of the rotor of the capacitor 23. The tuning of the output circuit of the tube 21 is accomplished by rotating the rotor of the capacitor 37 and the inductor 33, until a dip is observed in the reading of the plate current meter 39.

The components described so far in connection with Fig. 2, are conventional. This invention resides in the provision of the circuits and the components for indicating to an operator of the controls when the output circuit of the tube 21 is tuned to the fundamental of a desired frequency, described in the following.

The contact arms 30 and 38 of the switches 29 and 36 respectively, are connected by the mechanical linkage 40 to the rotary switch arm 42 of the range selector switch 43, which is arranged to touch the one of the contacts 45, 46, 47 or 48 which corresponds to the one of the contacts 25, 26, 27 or 28 with which the switch arm 30 is in contact.

The range to be tuned when the switch arm 30 is on the contact 25 may, for example, be from 2.0 to 3.1 megacycles; when the switch arm 30 is on the contact 26 may, for example, be from 3.1 to 4.8 megacycles; when the switch arm 30 is on the contact 27 may, for example, be from 7.5 to 11.4 megacycles, and when the switch arm 30 is on the contact 28, may, for example, be from 11.4 to 17.2 megacycles.

However, when the switch arm 30 is on the tap 25 for providing a range of from 2.0 to 3.1 megacycles in the tank circuit of the tube 22, the switch arm 38 of the switch 36 is on the tap 54 connected to the tap 34, providing a frequency coverage of from 2.0 to 7.5 megacycles in the tank circuit of the tube 21. Thus when the tank circuit of the tube 21 is tuned by adjusting the capacitor 37 and the tank inductor 33, it is possible to tune to a harmonic of the input frequency, and to receive an indication of resonance on the meter 39.

Likewise, for other positions of the switch arm 30 and corresponding positions of the switch arm 38, it is possible to tune the tank circuit of the tube 21 to harmonics of the input frequency.

For preventing such false indications of resonance, the wafer-type switches 56, 57, 58 and 59 have their rotary switch arms 60, 61, 62 and 63 respectively, connected to the contacts 45, 46, 47 and 48 respectively of the switch 43. The switch arms 60, 61, 62 and 63 are mechanically connected together and to the rotor of the capacitor 37 and to the tank inductor by the linkage 64, whereby rotation of the capacitor rotor and of the inductor 33, causes corresponding rotation of the switch arms 60, 61, 62 and 63.

Those contacts of the switch 56 which will be wiped by the contact arm 60 when the rotor of the capacitor 37 and the tank inductor 33 are rotated to tune the tank circuit of the tube 21 to frequencies above 3.1 megacycles when the switch arm 30 is on the contact 25, the switch arm 38 is on the contact 54, and the switch arm 42 is on the contact 45, are connected together by the wiring 66. The wiring 66 is connected in series with the wiring 67, the battery 68, the lamp 69, the switch arm 42, the contact 45, the switch arm 60 and the contacts of the switch 56 connected by the wiring 66, whereby when the switch arm 42 is on the contact 45 and the switch arm 60 touches any of the contacts interconnected by the wiring 66, the signal lamp 69 will be lighted. Thus when the operator is tuning the band 2.0 to 3.1 megacycles and observes that the lamp 69 is lighted when a dip in the reading of the meter 39 occurs, he will know the circuit is tuned to a harmonic of the desired frequency.

Likewise, those contacts of the switch 57 which are wiped by the switch arm 61 when the switch arm 30 is on the contact 26, the switch arm 38 is on the contact 34, and the switch arm 42 is on the contact 46, are interconnected by the wiring 70. The wiring 70 is connected in series with the wiring 67, the battery 68, the lamp 69, the switch arm 42, the contact 46, the switch arm 61 and the contacts of the switch 57 connected by the wiring 70, whereby when the switch arm 42 is on the contact 46 and the switch arm 61 touches any of the contacts interconnected by the wiring 70, the signal lamp 69 will be lighted. Thus when the operator is tuning the band 3.1–4.8 megacycles and observes that the lamp 69 is lighted when a dip in the reading of the meter 39 occurs, he will know that the circuit is tuned to a harmonic of the desired frequency.

Likewise, those contacts of the switch 58 which are wiped by the switch arm 62 when the rotor of the capacitor 37 and the tank inductor 33 are rotated to tune the tank circuit to frequencies above 11.4 megacycles when the switch arm 30 is on the contact 27, the switch arm 38 is on the contact 72, and the switch arm 42 is on the contact 47, are interconnected by the wiring 73. The wiring 73 is connected in series with the wiring 67, the battery 68, the lamp 69, the switch arm 42, the contact 47, the switch arm 62 and the contacts of the switch 58 interconnected by the wiring 73, whereby when the switch arm 42 is on the contact 47 and the switch arm 62 touches any of the contacts interconnected by the wiring 73, the signal lamp will be lighted. Thus when the operator is tuning the band 7.5–11.4 megacycles and observes that the lamp 69 is lighted when a dip in the reading of the meter 39 occurs, he will know that the circuit is tuned to a harmonic of the desired frequency.

Likewise, those contacts of the switch 59 which are wiped by the switch arm 63 when the rotor of the capacitor 37 and the tank inductor 33 are rotated to tune the tank circuit of the tube 21 to frequencies above 17.2 megacycles when the switch arm 30 is on the contact 28, the switch arm 38 is on the contact 35, and the switch arm 42 is on the contact 48, are interconnected by the wiring 75. The wiring 75 is connected in series with the wiring 67, the battery 68, the lamp 69, the switch arm 42, the contact 48, the switch arm 63 and the contacts of the switch 59 connected by the wiring 75, whereby when the switch arm 42 is on the contact 48, and the switch arm 63 touches any of the contacts interconnected by the wiring 75, the signal lamp 69 will be lighted. Thus when the operator is tuning the 11.4–17.2 megacycle band and observes that the lamp is lighted when a dip in the reading of the meter 39 occurs, he will know that the circuit is tuned to a harmonic of the desired frequency.

Other taps on the tank inductor coils, other contacts on the switches, and other wafer-type switches could be used to enable the circuits to be tuned to cover other frequency bands. In one embodiment of this invention in actual use, eleven frequency bands were tuned.

While the form of signal in the tuning indicator has been illustrated and described as an incandescent lamp, audible or other forms of signals could be used.

I claim as my invention:

1. A tuning control for an electrical circuit, comprising an inductor, a capacitor for tuning said inductor, said capacitor having a rotor, a switch having a switch arm and having a plurality of contacts therefor, means interconnecting said switch arm and said rotor whereby rotation of said rotor causes movement of said arm, a signal circuit, and means including said switch connecting a plurality of said contacts in said signal circuit when said arm touches contacts of said plurality of contacts.

2. A tuning control as claimed in claim 1 in which the switch arm wipes the contacts of said plurality of contacts when rotation of the rotor decreases the capacity of the capacitor.

3. A tuning control for an electrical circuit, comprising a tapped inductor, a capacitor for tuning said inductor, said capacitor having a rotor, a plurality of switches each having a rotary switch arm and having a plurality of contacts therearound, means interconnecting said switch arms and said rotor whereby rotation of said rotor causes rotation of said arms, a range selector switch having a switch arm and a plurality of contacts therefor, means electrically connecting said last-mentioned contacts to said first-mentioned switch arms, a tap selector switch having a switch arm and contacts therefor, means electrically connecting said last-mentioned contacts to different portions of said inductor, and a signal circuit including the switch arms and a plurality of the contacts of said first-mentioned switches, and including the switch arm of said range selector switch.

4. A tuning control as claimed in claim 3 in which the range selector switch arm and the tap selector switch arm are mechanically connected for simultaneous movement.

5. A tuning control as claimed in claim 3 in which the first-mentioned switch arms wipe the last-mentioned contacts when rotation of the rotor decreases the capacity of the capacitor.

6. A tuning control for a tank circuit of an electron tube having an anode, comprising a tank inductor connected to said anode, a source of potential and a resonance indicator connected to said inductor in series therewith, a capacitor for tuning said inductor, said capacitor having a rotor, a switch having a rotary switch arm and having contacts therearound, means interconnecting said arm and said rotor whereby rotation of said rotor causes rotation of said arm, said rotor during a first portion of its rotation tuning said inductor over one frequency range and during a second portion of its rotation tuning said inductor over a higher frequency range, said switch arms wiping a plurality of said contacts when said rotor is rotated through one of said portions of rotation, and a signal circuit including said switch arm and said contacts of said plurality of said contacts.

7. A tuning control as claimed in claim 6 in which the contacts included in the signal circuit are those wiped by the switch arm during rotation of the rotor through the said second portion of its rotation.

8. A tuning control for the tank circuit of an oscillator tube having an anode, comprising a tapped tank inductor connected to said anode, a source of potential and a resonance indicator connected to said inductor in series therewith, a capacitor for tuning said inductor, said capacitor having a rotor, a plurality of switches each having a rotary switch arm and having contacts therearound, means interconnecting said switch arms and said rotor whereby rotation of said rotor causes said arms to rotate and to wipe said contacts, a range selector switch having a switch arm and a plurality of contacts therefor, means electrically connecting said last-mentioned contacts to said first-mentioned switch arms, a tap selector switch having a switch arm and having contacts connected to different portions of said tank inductor, means mechanically connecting said range selector and tap selector switch arms for simultaneous adjustment, said rotor during a portion of its rotation tuning said inductor over one frequency band for each position of said range finder and tap selector switches, and during another portion of its rotation tuning said inductor over a higher frequency band for each of said positions, said first-mentioned switch arms wiping a plurality of said first-mentioned contacts when said inductor is tuned to the lower frequency bands, and wiping another plurality of said first-mentioned contacts when said inductor is tuned to the higher frequency bands, and a signal circuit including the switch arms and the contacts wiped thereby when the inductor is tuned over the higher frequency bands, and including the switch arm of said range selector switch.

MARK I. JACOB.

REFERENCES CITED

The following references are of record in the file of this patent:

UNITED STATES PATENTS

| Number | Name | Date |
|---|---|---|
| 1,964,449 | Carlson | June 26, 1934 |
| 1,987,857 | Lewis | Jan. 15, 1935 |
| 2,370,056 | Mabry | Feb. 20, 1945 |